United States Patent
Stevenson et al.

(10) Patent No.: US 9,899,228 B2
(45) Date of Patent: *Feb. 20, 2018

(54) SHOWERHEAD ELECTRODE ASSEMBLIES FOR PLASMA PROCESSING APPARATUSES

(71) Applicant: Lam Research Corporation, Fremont, CA (US)

(72) Inventors: Tom Stevenson, Morgan Hill, CA (US); Rajinder Dhindsa, San Jose, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 920 days.

This patent is subject to a terminal disclaimer.

(21) Appl. No.: 14/170,732

(22) Filed: Feb. 3, 2014

(65) Prior Publication Data

US 2014/0154888 A1     Jun. 5, 2014

Related U.S. Application Data

(62) Division of application No. 12/155,739, filed on Jun. 9, 2008, now Pat. No. 8,679,288.

(51) Int. Cl.
  *C23F 1/00*  (2006.01)
  *H01L 21/00* (2006.01)
  (Continued)

(52) U.S. Cl.
  CPC .... *H01L 21/3065* (2013.01); *C23C 16/45565* (2013.01); *C23C 16/52* (2013.01);
  (Continued)

(58) Field of Classification Search
  None
  See application file for complete search history.

(56) References Cited

U.S. PATENT DOCUMENTS 4,598,249 A   7/1986 Goodman et al.
4,654,754 A   3/1987 Daszkowski
  (Continued)

FOREIGN PATENT DOCUMENTS

JP   9027398 A    1/1997
JP   2001156043 A 6/2001
  (Continued)

OTHER PUBLICATIONS

S.D. Glasgow et al., Performance Testing of Thermal Interface Filler Materials in a Bolted Aluminum Interface Under Thermal/Vacuum Conditions, Jun. 2003, NASA/TM-2003-212500, Marshall Space Flight Center, MSFC, Alabama.
  (Continued)

*Primary Examiner* — Karla Moore

(57) ABSTRACT

Showerhead electrode assemblies are disclosed, which include a showerhead electrode adapted to be mounted in an interior of a vacuum chamber; an optional backing plate attached to the showerhead electrode; a thermal control plate attached to the backing plate or to the showerhead electrode at multiple contact regions across the backing plate; and at least one interface member separating the backing plate and the thermal control plate, or the thermal control plate and showerhead electrode, at the contact regions, the interface member having a thermally and electrically conductive gasket portion and a particle mitigating seal portion. Methods of processing semiconductor substrates using the showerhead electrode assemblies are also disclosed.

20 Claims, 3 Drawing Sheets

(51) Int. Cl.

| | | |
|---|---|---|
| *C23C 16/00* | (2006.01) | |
| *H01L 21/3065* | (2006.01) | |
| *C23C 16/455* | (2006.01) | |
| *C23C 16/52* | (2006.01) | |
| *H01J 37/32* | (2006.01) | |
| *H01L 21/67* | (2006.01) | |

(52) U.S. Cl.
CPC .. *H01J 37/32091* (2013.01); *H01J 37/32532* (2013.01); *H01J 37/32541* (2013.01); *H01J 37/32568* (2013.01); *H01J 37/32605* (2013.01); *H01L 21/67069* (2013.01)

(56) References Cited

U.S. PATENT DOCUMENTS

| | | |
|---|---|---|
| 4,782,893 A | 11/1988 | Thomas |
| 4,960,612 A | 10/1990 | Dentini et al. |
| 5,518,758 A | 5/1996 | Tiburtius et al. |
| 5,534,751 A | 7/1996 | Lenz et al. |
| 5,545,473 A | 8/1996 | Ameen et al. |
| 5,660,917 A | 8/1997 | Fujimori et al. |
| 5,679,457 A | 10/1997 | Bergerson |
| 5,766,364 A | 6/1998 | Ishida et al. |
| 5,781,412 A | 7/1998 | de Sorgo |
| 6,050,216 A | 4/2000 | Szapucki et al. |
| 6,073,577 A | 6/2000 | Lilleland et al. |
| 6,096,414 A | 8/2000 | Young |
| 6,131,646 A | 10/2000 | Kelley |
| 6,165,612 A | 12/2000 | Misra |
| 6,220,607 B1 | 4/2001 | Schneider et al. |
| 6,247,703 B1 | 6/2001 | Forry et al. |
| 6,331,349 B1 | 12/2001 | Kalinoski et al. |
| 6,343,647 B2 | 2/2002 | Kim et al. |
| 6,365,063 B2 | 4/2002 | Collins et al. |
| 6,376,385 B2 | 4/2002 | Lilleland et al. |
| 6,433,484 B1 | 8/2002 | Hao et al. |
| 6,468,925 B2 | 10/2002 | Campbell et al. |
| 6,475,933 B1 | 11/2002 | Brown et al. |
| 6,491,784 B2 | 12/2002 | Yamaguchi et al. |
| 6,496,373 B1 | 12/2002 | Chung |
| 6,651,736 B2 | 11/2003 | Chiu et al. |
| 6,733,015 B2 | 5/2004 | Forry et al. |
| 6,782,843 B2 | 8/2004 | Kinnard et al. |
| 6,818,097 B2 | 11/2004 | Yamaguchi et al. |
| 6,824,627 B2 | 11/2004 | Dhindsa et al. |
| 7,014,959 B2 | 3/2006 | Crawford et al. |
| 7,017,269 B2 | 3/2006 | White et al. |
| 7,067,432 B2 | 6/2006 | Xu et al. |
| 7,137,444 B2 | 11/2006 | Faybishenko et al. |
| 7,159,537 B2 | 1/2007 | Wickramanayaka et al. |
| 7,205,050 B2 | 4/2007 | Haas |
| 7,208,192 B2 | 4/2007 | Bunyan et al. |
| 7,220,937 B2 | 5/2007 | Hofman et al. |
| 7,255,629 B2 | 8/2007 | Birang et al. |
| 7,645,341 B2 | 1/2010 | Kennedy et al. |
| 7,862,682 B2 | 1/2011 | Stevenson et al. |
| 8,216,418 B2 | 7/2012 | Patrick et al. |
| 8,679,288 B2 * | 3/2014 | Stevenson ......... C23C 16/45565 118/715 |
| 2004/0129211 A1 | 7/2004 | Blonigan et al. |
| 2005/0133160 A1 | 6/2005 | Kennedy et al. |
| 2005/0241765 A1 | 11/2005 | Dhindsa et al. |
| 2005/0241766 A1 | 11/2005 | Dhindsa et al. |
| 2006/0137607 A1 | 6/2006 | Seo et al. |
| 2007/0068629 A1 | 3/2007 | Shih et al. |
| 2008/0064126 A1 | 3/2008 | Gaff |
| 2008/0078744 A1 | 4/2008 | Wang et al. |

FOREIGN PATENT DOCUMENTS

| | | |
|---|---|---|
| JP | 2007227789 A | 9/2007 |
| JP | 2008106366 A | 5/2008 |

OTHER PUBLICATIONS

U.S. Appl. No. 11/896,375, "Showerhead Electrode Assemblies For Plasma Processing Apparatus", filed Aug. 31, 2007.

International Search Report and Written Opinion dated Nov. 20, 2009 for PCT/US2009/003186.

Official Action dated Dec. 11, 2012 for Japanese Patent Appln. No. 2011-513478.

* cited by examiner

SHOWERHEAD ELECTRODE ASSEMBLIES FOR PLASMA PROCESSING APPARATUSES

This application is a divisional of U.S. patent application Ser. No. 12/155,739, entitled SHOWERHEAD ELECTRODE ASSEMBLIES FOR PLASMA PROCESSING APPARATUSES, filed on Jun. 9, 2008, the entire content of which is hereby incorporated by reference.

BACKGROUND

In the field of semiconductor devices processing, semiconductor material processing apparatuses including vacuum processing chambers, are used to perform various processes, such as etching and deposition of various materials on substrates, and resist stripping. As semiconductor technology evolves, decreasing device sizes, for example, transistor sizes, call for an ever higher degree of accuracy, repeatability and cleanliness in wafer processes and process equipment. Various types of equipment exist for semiconductor processing, including applications that involve the use of plasmas, such as plasma etch, plasma-enhanced chemical vapor deposition (PECVD) and resist strip and the like. The types of equipment required for these processes include components which are disposed within the plasma chamber, and must function in that environment. The environment inside the plasma chamber may include exposure to the plasma, exposure to etchant gasses, and thermal cycling. Materials used for such components must be adapted to withstand the environmental conditions in the chamber, and do so for the processing of many wafers which may include multiple process steps per wafer. To be cost effective, such components must often withstand hundreds or thousands of wafer cycles while retaining their functionality and cleanliness. There is generally extremely low tolerance for components which produce particles, even when those particles are few and no larger than a few tens of nanometers. It is also necessary for components selected for use inside plasma processing chambers to meet these requirements in the most cost-effective manner.

SUMMARY

An embodiment of a showerhead electrode assembly comprises a showerhead electrode adapted to be mounted in an interior of a vacuum chamber and powered by radio frequency (RF) energy; a backing plate attached to the showerhead electrode; a thermal control plate attached to the backing plate via a plurality of fasteners at multiple contact regions across the backing plate; and interface members separating the backing plate and the thermal control plate at the contact regions, wherein each interface member comprises a thermally and electrically conductive gasket portion bounded on a periphery by a particle mitigating seal portion.

An embodiment of a method of controlling plasma etching in a plasma etching chamber comprises supplying process gas to the plasma etching chamber through the showerhead electrode assembly, the process gas flowing into a gap between the showerhead electrode and a bottom electrode on which a semiconductor substrate is supported; and etching a semiconductor substrate in the plasma etching chamber by applying RF power to the showerhead electrode and energizing the process gas into a plasma state, wherein the temperature of the showerhead electrode is controlled by the thermal control plate via enhanced thermal conduction through the thermally and electrically conductive gasket portion of the interface members. In the method, the above-described embodiment of the showerhead electrode assembly can be used.

Another embodiment of a showerhead electrode assembly comprises a showerhead electrode adapted to be mounted in an interior of a vacuum chamber; a thermal control plate attached to the showerhead electrode at multiple contact regions across the showerhead electrode with plenums between the thermal control plate and the showerhead electrode located between the contact regions; and an interface member separating the showerhead electrode and the thermal control plate, at each of the contact regions, wherein the interface member comprises a thermally and electrically conductive gasket portion bounded on a periphery by a particle mitigating seal portion.

DETAILED DESCRIPTION

Plasma processing apparatuses for semiconductor substrates, such as silicon wafers, include plasma etch chambers which are used in semiconductor device manufacturing processes to etch such materials as semiconductors, metals and dielectrics. For example, a dielectric etch chamber might be used to etch materials such as silicon dioxide or silicon nitride. During the etch process, components within the etch chamber heat up and cool down and experience thermal stresses as a result. For actively heated components of a heated showerhead assembly, this temperature cycling can result in increased particle generation.

A showerhead electrode assembly having a heater to prevent the showerhead electrode from falling below a minimum temperature is described in commonly-owned U.S. Patent Publication No. 2005/0133160A1, the disclosure of which is hereby incorporated by reference in its entirety. The heater cooperates with a thermal control plate in heat transfer with a temperature controlled top plate which forms a top wall of a plasma etch chamber.

Figure 1:
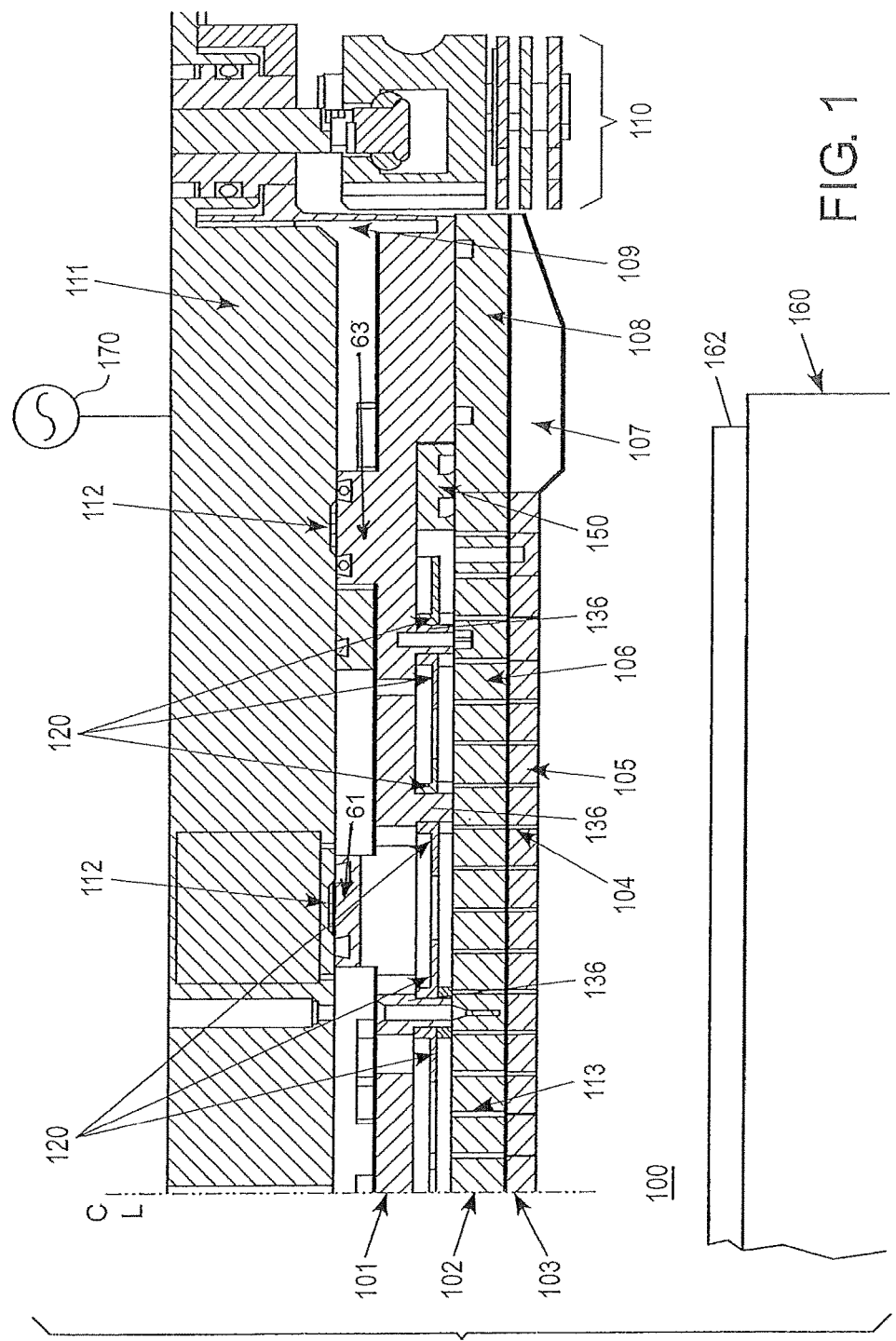
FIG. 1 illustrates an exemplary embodiment of a showerhead electrode assembly of a semiconductor material plasma processing apparatus.

FIG. 1 depicts one-half of a showerhead assembly 100 of a parallel plate capacitively-coupled plasma chamber (vacuum chamber) comprising a top electrode 103 and an optional backing member 102 secured to the top electrode 103, a thermal control plate 101, and a top plate 111. Thermal chokes 112 can be provided on the upper surface of the thermal control plate 101. The top electrode 103 is positioned above a substrate support 160 supporting a semiconductor substrate 162, e.g., semiconductor wafer.

The top plate 111 can form a removable top wall of the plasma processing apparatus, such as a plasma etch chamber. As shown, the top electrode 103 can include an inner electrode member 105, and an optional outer electrode member 107. The inner electrode member 105 is typically made of single crystal silicon. If desired, the inner and outer electrodes 105, 107 can be made of a single piece of material such as CVD silicon carbide, single crystal silicon or other suitable material.

The inner electrode member 105 can have a diameter smaller than, equal to, or larger than a wafer to be processed, e.g., up to 200 mm. For processing larger semiconductor substrates such as 300 mm wafers, the outer electrode member 107 is adapted to expand the diameter of the top electrode 103 from about 12 inches to about 19 inches, such as about 15 inches to about 17 inches. The outer electrode member 107 can be a continuous member (e.g., a polysilicon or silicon carbide member, such as a ring), or a segmented member (e.g., 2-6 separate segments arranged in a ring configuration, such as segments of single crystal silicon). In embodiments in which the top electrode 103 includes a multiple-segment outer electrode member 107, the segments preferably have edges which overlap each other to protect an underlying bonding material from exposure to plasma. The inner electrode member 105 preferably includes multiple gas passages 104 for injecting a process gas into a space in a plasma reaction chamber below the top electrode 103. Optionally, the outer electrode member 107 can include multiple gas passages (not shown). The outer electrode 107 preferably forms a raised step at the periphery of the electrode 103 which does not include gas passages. Further details of a stepped electrode can be found in commonly-owned U.S. Pat. No. 6,824,627, the entire disclosure of which is hereby incorporated by reference.

Single crystal silicon is a preferred material for plasma exposed surfaces of the inner electrode member 105 and the outer electrode member 107. High-purity, single crystal silicon minimizes contamination of substrates during plasma processing as it introduces only a minimal amount of undesirable elements into the reaction chamber, and also wears smoothly during plasma processing, thereby minimizing particles.

The showerhead electrode assembly 100 can be sized for processing large substrates, such as semiconductor wafers having a diameter of 300 mm. For 300 mm wafers, the top electrode 103 is at least 300 mm in diameter. However, the showerhead electrode assembly can be sized to process other wafer sizes or substrates having a non-circular configuration such as substrates for flat panel displays.

The backing member 102 includes a backing plate 106 and optionally a backing ring 108. In such configurations, the inner electrode member 105 is co-extensive with the backing plate 106, and the outer electrode member 107 is co-extensive with the surrounding backing ring 108. However, the backing plate 106 can extend beyond the inner electrode member such that a single backing plate can be used to support the inner electrode member and the segmented outer electrode member or support a single piece inner electrode and outer electrode. The inner electrode member 105 and the outer electrode member 107 are preferably attached to the backing member 102 by a bonding material, such as an elastomeric bonding material. The backing plate 106 includes gas passages 113 aligned with the gas passages 104 in the inner electrode member 105 to provide gas flow into the plasma processing chamber. If the outer electrode 107 includes gas passages, the backing ring 108 includes gas passages aligned with such optional gas passages in the outer electrode 107 (not shown). The gas passages 113 can typically have a diameter of about 0.04 inch, and the gas passages 104 can typically have a diameter of about 0.025 inch.

In the embodiment, the backing plate 106 and backing ring 108 are made of an aluminum material, which is typically an aluminum alloy material such as 6061 or other alloy suitable for use in semiconductor processing. The backing plate 106 and backing ring 108 can be made of bare aluminum, i.e., aluminum that has a surface native oxide (and is not anodized).

The top electrode 103 can be attached to the backing plate 106 and backing ring 108 with a thermally and electrically conductive elastomer bonding material that accommodates thermal stresses, and transfers heat and electrical energy between the top electrode 103 and the backing plate 106 and backing ring 108. Alternatively, the elastomer can be thermally conductive, but not electrically conductive. The use of elastomers for bonding together surfaces of an electrode assembly is described, for example, in commonly-owned U.S. Pat. No. 6,073,577, which is incorporated herein by reference in its entirety.

The backing plate 106 and the backing ring 108 are preferably attached to the thermal control plate 101 with suitable fasteners, which can be threaded bolts, screws, or the like. For example, bolts (not shown) can be inserted in holes in the thermal control plate 101 and screwed into threaded openings in the backing member 102. The thermal control plate 101 is in heat transfer relationship with an actively controlled heater. See, for example, FIGS. 1 and 2 and the description thereof in commonly-owned U.S. Published Application No. 2005/0133160A1, the entire disclosure of which is hereby incorporated by reference. The holes in the thermal control plate 101 can be oversized to allow for movement due to differences in thermal expansion that accommodates thermal stresses. The thermal control plate 101 includes a flexure portion 109 and is preferably made of a machined metallic material, such as aluminum, an aluminum alloy such as aluminum alloy 6061 or other alloy suitable for use in semiconductor processing. The thermal control plate 101 can be made of bare aluminum, i.e., aluminum that has a surface native oxide (and is not anodized). The top plate 111 is preferably made of aluminum or an aluminum alloy such as aluminum alloy 6061. A plasma confinement assembly 110 is shown outwardly of the showerhead electrode assembly 100. A suitable plasma confinement assembly including a vertically-adjustable, plasma confinement ring assembly is described in commonly-owned U.S. Pat. No. 6,433,484, which is incorporated herein by reference in its entirety.

The thermal control plate 101 preferably includes at least one heater operable to cooperate with the temperature-controlled top plate 111 to control the temperature of the top electrode 103. For example, in a preferred embodiment, the heater is provided on the upper surface of the thermal control plate 101 and includes a first heater zone surrounded by a first projection 61, a second heater zone between the first projection 61 and a second projection 63, and a third heater zone between the second projection 63 and the flexure portion 109. The number of heater zones can be varied; for example, in other embodiments the heater can include a single heater zone, two heater zones, or more than three heater zones. The heater can alternatively be provided on a bottom surface of the thermal control plate.

The heater preferably comprises a laminate including a resistively heated material disposed between opposed layers of a polymeric material that can withstand the operating temperatures reached by the heater. An exemplary polymeric material that can be used is a polyimide sold under the trademark Kapton®, which is commercially available from E.I. du Pont de Nemours and Company. Alternatively, the heater can be a resistive heater embedded in the thermal control plate (e.g., a heating element in a cast thermal control plate or a heating element located in a channel formed in the thermal control plate). Another embodiment of the heater includes a resistive heating element mounted on the upper and/or lower surface of the thermal control plate. Heating of the thermal control plate can be achieved via conduction and/or radiation.

The heater material can have any suitable pattern that provides for thermally uniform heating of the first heater zone, second heater zone, and third heater zone. For example, the laminate heater can have a regular or non-regular pattern of resistive heating lines such as a zig-zag, serpentine, or concentric pattern. By heating the thermal control plate with the heater, in cooperation with operation of the temperature-controlled top plate, a desirable temperature distribution can be provided across the top electrode during operation of the showerhead electrode assembly.

The heater sections located in the first heater zone, second heater zone, and third heater zone can be secured to the thermal control plate by any suitable technique, e.g., the application of heat and pressure, adhesive, fasteners, or the like.

The top electrode can be electrically grounded, or alternatively can be powered, preferably by a radio-frequency (RF) current source 170. The output power of the RF current source 170 powering the top electrode can have a frequency ranging from 50 to 80 MHz, preferably a frequency of 60 MHz, or a similar frequency. In such an alternative embodiment, the bottom electrode can be coupled to the ground potential and the top electrode coupled to the RF source 170. The RF source 170 can have a voltage of between about 100 volts and about 2000 volts. In a preferred embodiment, the top electrode is grounded, and power at one or more frequencies is applied to the bottom electrode to generate plasma in the plasma processing chamber. The RF source 170 powering the bottom electrode can have a frequency of between about 400 kHz and about 60 MHz. For example, the bottom electrode can be powered at frequencies of 2 MHz and 27 MHz by two independently controlled radio frequency power sources.

After a substrate has been processed (e.g., a semiconductor substrate has been plasma etched), the supply of power to the bottom electrode is shut off to terminate plasma generation. The processed substrate is removed from the plasma processing chamber, and another substrate is placed on the substrate support for plasma processing. In a preferred embodiment, the heater is activated to heat the thermal control plate 101 and, in turn, the top electrode 103, when power to the bottom electrode is shut off. As a result, the top electrode 103 temperature is preferably prevented from decreasing below a desired minimum temperature. For etching dielectric materials, the top electrode temperature is preferably maintained at approximately a constant temperature such as 150 to 250° C. between successive substrate processing runs so that substrates are processed more uniformly, thereby improving process yields. The power supply preferably is controllable to supply power at a desired level and rate to the heater based on the actual temperature and the desired temperature of the top electrode.

In exemplary embodiments, the top electrode 103 can be heated to a temperature of at least about 80° C., such as heating and maintaining at least a portion of the showerhead electrode at a temperature of at least 100° C., at least about 150° C., or at least 180° C. The top electrode 103 can be heated before etching of a semiconductor substrate. The etching can comprise etching openings in an oxide layer on the semiconductor substrate, where the openings are defined by a patterned photoresist.

The plasma chamber can also include, for example, a temperature controller; a power supply adapted to supply power to a heater which heats the thermal control plate in thermal response to the temperature controller; a fluid control adapted to supply fluid to a temperature controlled top wall of the chamber in response to the temperature controller; and a temperature sensor arrangement adapted to measure the temperature of one or more portions of the showerhead electrode and supply information to the temperature controller.

The illustrated embodiment of the showerhead electrode assembly also comprises an aluminum baffle ring arrangement 120 used to distribute process gasses in a plasma chamber. The aluminum baffle ring arrangement 120 in FIG. 1 includes six rings made from aluminum or an aluminum alloy, such as 6061 aluminum, which comprises by weight from about 96 to about 98% Al, about 0.8 to about 1.2% Mg, about 0.4 to about 0.8% Si, about 0.15 to 0.4% Cu, about 0.04 to 0.35% Cr, and optionally Fe, Mn, Zn and/or Ti. The baffle rings 120 can have an anodized outer surface. The six concentric L-shaped rings are located within the plenums above the backing member 102 and below the thermal control plate 101. For example, a central plenum can include a single ring, the adjacent plenum can include two rings separated by a ½ to 1 inch gap, the next adjacent plenum can include two rings separated by a ½ to 1 inch gap and an outer plenum can include a single ring. The rings are mounted to the thermal control plate 101 with screws. For example, each ring can include circumferentially spaced apart stand-offs or bosses with through holes for receiving the screws, e.g., three bosses arranged apart can be used. Each ring can have a horizontal section of about 0.040 inch thickness and a vertical flange of about ¼ inch in length.

When the top surface 134 of the aluminum backing plate 106 and an annular projection 136 of the thermal control plate 101 come into contact in a contact region 132 during operation of the showerhead electrode assembly 100, galling can occur between the thermal control plate 101 and the aluminum backing member 102 including the backing plate 106 and backing ring 108 along contact regions located between them. Details of galling are described in commonly-owned co-pending U.S. patent application Ser. No. 11/896,375, the entire contents of which are hereby incorporated by reference. In the thermal control plate 101, the contact regions 132 can cover about 1% to about 30% of the surface area of the backing plate 102.

This galling can occur on both of the thermal control plate 101 and aluminum backing member 102, and is caused by relative motion and rubbing occurring between the opposed surfaces of the thermal control plate 101 and aluminum backing member 102 as a result of temperature cycling. This galling is highly undesirable for a number of reasons. First, galling can cause a reduction in thermal transfer and thus a shift in the temperature including, for example, a localized temperature non-uniformity, of the top electrode 103 including the illustrated inner electrode member 105. This temperature shift can cause a process shift during processing of semiconductor substrates in the plasma processing chamber.

Galling of the thermal control plate 101 and aluminum backing member 102 can also cause particle generation, or cause fusing of the thermal control plate 101 and aluminum backing member 102, which then requires excessive force to separate these components, which can result in damage to these components.

Galling of the thermal control plate 101 and aluminum backing member 102 can also increase the difficulty of cleaning the top electrode 103.

Additionally, galling of the thermal control plate 101 and aluminum backing member 102 degrades the cosmetic appearance of these components and reduces their lifetime.

Figure 2:
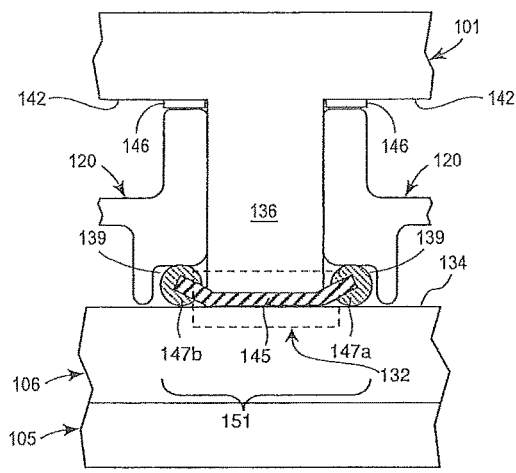
FIG. 2 is an enlarged view of a portion of the showerhead electrode assembly shown in FIG. 1 including an embodiment of an interface member.

FIG. 2 illustrates an exemplary embodiment of the showerhead electrode assembly including a modification that reduces the occurrence of galling of the thermal control plate 101 and aluminum backing plate 106 and backing ring 108 and consequently also reduces problems associated with such galling. Particularly, as shown in FIG. 2, an interface member 151 which comprises a thermally and electrically conductive gasket 145 and particle mitigating seal portions 147*a* and 147*b*, is located between the bottom surface of the annular projection 136 of the thermal control plate and the top surface 134 of the aluminum backing plate 102.

Figure 3:
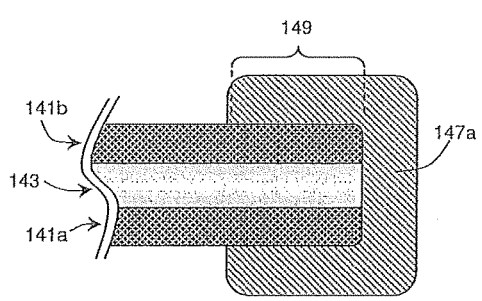
FIG. 3 is a schematic diagram of an embodiment of an interface member.

FIG. 3 shows a cross-section of a portion of an embodiment of an interface member 151. As depicted, the interface member 151 comprises a thermally and electrically conductive gasket portion 145 bounded on a periphery 149 by a particle mitigating seal portion 147*a*. In this embodiment, the gasket portion 145 preferably comprises a laminate of coaxial annular rings such as a central portion 143 sandwiched between upper and lower portions 141*a* and 141*b*. For example, the central portion 143 can be a strip of aluminum and the upper and lower portions 141*a*/141*b* can be strips of carbon loaded silicone. Alternatively, the gasket portion 145 is a thermal filler material such as a silicone filled with boron nitride (such as CHO-THERM 1671 manufactured by Chomerics), a graphite (such as eGraf 705 manufactured by Graftech), an indium foil, a sandwich (such as Q-pad II by Bergquist), or a phase change material (PCM) (such as T-pcm HP105 by Thermagon).

The thermally and electrically conductive gasket portion 145 can be, for example, a conductive silicone-aluminum foil sandwich gasket structure, or a elastomer-stainless steel sandwich gasket structure. In a preferred embodiment, the gasket 145 is Bergquist Q-Pad II composite materials available from The Bergquist Company, located in Chanhassen, Minn. These materials comprise aluminum coated on both sides with thermally/electrically conductive rubber. The materials are compatible in vacuum environments. The contact surfaces of the thermal control plate and aluminum backing member, e.g., backing plate, each have some degree of roughness caused by processing, e.g., machining. The gasket material is preferably also sufficiently compliant so that it compensates for surface roughness of the contact surface and effectively fills regions (e.g., microvoids) of the contact surfaces to enhance thermal contact between the contact surfaces. Most preferably, the gasket portion is Lambda Gel COH-4000 (available from Geltec).

To minimize graphite generation from the gasket material, the gaskets can be cleaned using deionized water, such as by wiping. The gasket material can alternatively be coated with a suitable coating material, such as a fluoroelastomer material.

The particle mitigating seal portion 147*a*/147*b* can be an elastomer or a polymer resistant to erosion from radicals in a vacuum environment. Preferably, the seal portion 147*a*/147*b* is an in-situ cured elastomer or polymer resistant to erosion from radicals produced by plasma in a vacuum environment and resistant to degradation at high temperatures such as above 200° C. Polymeric materials which can be used in plasma environments above 160° C. include polyimide, polyketone, polyetherketone, polyether sulfone, polyethylene terephthalate, fluoroethylene propylene copolymers, cellulose, triacetates, silicone, and rubber.

More preferably, the seal portion 147*a*/147*b* is an in-situ room temperature vulcanized (RTV) unfilled silicone exhibiting appropriate pre-cure and post-cure properties such as adhesion strength, elastic modulus, erosion rate, temperature resistance and the like. For example, an in-situ curable silicone can be a two-part or one-part curing resin using platinum, peroxide or heat. Preferably, the silicone elastomer material has a Si—O backbone with methyl groups (siloxane). However, carbon or carbon-fluorine backbones can also be used. Most preferably, the silicone material cures in-situ for isolating the thermally and electrically conductive gasket portion 145 from the vacuum environment in the chamber forming an unfilled, cross-linked silicone rubber. An especially preferred elastomer is a polydimethylsiloxane containing elastomer such as a catalyst cured, e.g. Pt-cured, elastomer available from Rhodia as Rhodorsil V217, an elastomer which is stable at temperatures of 250° C. and higher.

The thermally and electrically conductive gasket 145 is made of a material that is electrically conductive (to provide an RF path to the electrode) and thermally conductive to provide electrical and thermal conduction between the thermal control plate 101 and the aluminum backing plate 106. The gasket 145 provides an electrically-conductive thermal interface. The gasket 145 also enhances heat transfer between the top electrode 103 including the inner electrode member 105 and the thermal control plate 101. The particle mitigating seal portion 147*a*/147*b* can be dip coated, molded, spray coated or the like onto the periphery 149 of the thermally and electrically conductive gasket portion 145.

Figure 4:
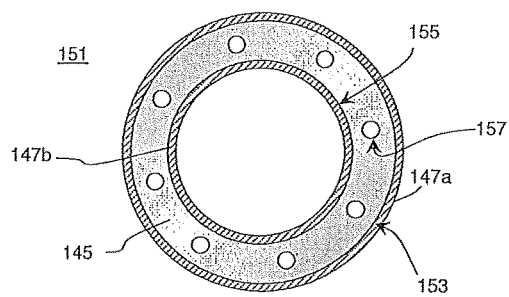
FIG. 4 is a plan view of an embodiment of an interface member.

Preferably, the seal portion 147*a*/147*b* is spray coated onto the periphery 149 of the gasket portion 145. Spray coating can result in the mitigating seal portion 147*a*/147*b* having various cross-sectional shapes (profiles), for example, FIG. 3 shows a mitigating seal portion 147*a*/147*b* having a rounded-rectangular cross section. If desired, the gasket portion 145 can be in the shape of an annular ring having an outward perimeter and an inward aperture where the particle mitigating seal portion 147*a* and 147*b*, respectively, is bonded to the gasket portion 145. FIG. 4 shows a plan view of an embodiment of an interface member 151 comprising the gasket portion 145 shaped as an annular ring with the seal portion 147*a* bonded to the outward perimeter 149 and the seal portion 147*b* bonded to the inner aperture 155. Bolt holes 157 are also shown in FIG. 4, which allow bolts (not shown) to be inserted in holes in the thermal control plate 101 and screwed into threaded openings in the backing plate 106 and backing ring 108 with the interface member 151 located between the bottom surface of the annular projection 136 of the thermal control plate and the top surface 134 of the aluminum backing plate 102.

Figure 5A:
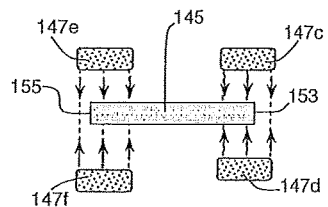
FIGS. 5A-5C illustrate an embodiment of an interface member.
Figure 5B:
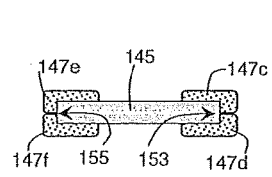
Figure 5C:
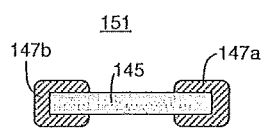

Also preferably, as shown in FIG. 5A, the seal portion 147*a*/147*b* can be in the form of uncured elastomeric sheets 147*c*/147*d*/147*e*/147*f* in the shape of annular rings sized to overlap the outward perimeter and the inward aperture of the gasket portion 145. The uncured elastomeric sheets 147*c*/147*d*/147*e*/147*f* can be located on the gasket portion 145 (FIG. 5B) and cured to provide an interface member 151 (FIG. 5C).

As shown in FIG. 2, the particle mitigating seals 147a/147b can be shaped such as O-rings disposed on the outer and inner periphery 149 of each annular gasket portion 145. More generally, (with reference to FIGS. 2 and 4) the particle mitigating seal portions 147a/147b of the interface member 151 can have a curved surface and protrude from the outward perimeter 153 and inward aperture 155 of each thermally and electrically conductive gasket portion 145. A plurality of annular projections 136 and annular thermally and electrically conductive gasket portions 145 result in a plurality of seals 147a/147b, for example, from 4 to 20 seal portions 147a/147b. The plurality of annular gasket portions 145 require fairly precise placement. Since the interface member 151 provides the particle mitigating seal portions 147a/147b bonded to the periphery 149 of the gasket portion 145, installation of the interface member 151 simplifies precise installation of a thermally and electrically conductive gasket portion 145 sealed off from the vacuum chamber by particle mitigating seal portions 147a/147b. Particularly, when the contact surfaces of the annular gaskets 145 in contact regions 132 are small to allow for variations in location during installation.

As also shown in FIG. 2, shims 146 having about the same thickness as the gasket 145 are located between the aluminum baffle rings 120 and the bottom surface 142 of the thermal control plate 101. The shims 146 can be of a dielectric material.

The thermal control plate 101 includes several annular projections 136 establishing plenums at the backside of the backing plate 106, e.g., 2 to 10, preferably 4 to 8 projections. An interface member 151 is arranged over the contact surfaces of each annular projection.

Figures 6, 7:
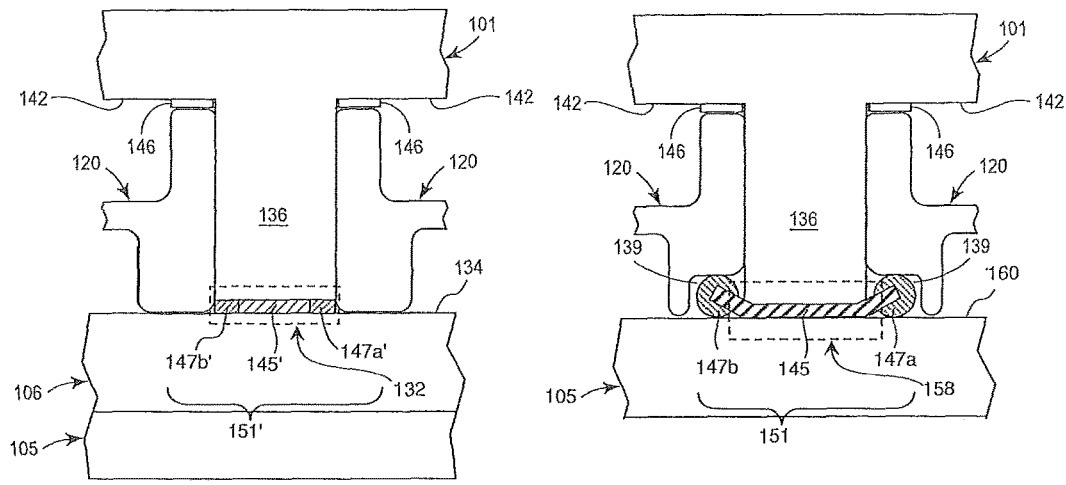
FIG. 6 is an enlarged view of a portion of a showerhead electrode assembly shown in FIG. 1 including another embodiment of an interface member.
FIG. 7 illustrates a portion of a showerhead electrode assembly according to another embodiment including an embodiment of an interface member.

FIG. 6 shows another embodiment of an interface member 151' located between the bottom surface of the annular projection 136 of the thermal control plate and the top surface 134 of the aluminum backing plate 102. As depicted, this embodiment of an interface member 151' has a thermally and electrically conductive gasket portion 145' bounded on each periphery by a particle mitigating portion 147a'/147b'. For example, the interface member 151' shown in FIG. 6 has an annular thermally and electrically conductive gasket portion 145' bounded on an outer perimeter by a first co-planar particle mitigating seal portion 147a' and bounded on an inner aperture by a second co-planar particle mitigating seal portion 147b'. Such an embodiment of a showerhead electrode assembly including the interface member 151' has a fewer number of parts than required if installing a plurality of separate thermally and electrically conductive gaskets and a separate outer and inner seal such as an O-ring, for each thermally and electrically conductive gasket. The interface member 151' is easy to install and completely covers contact regions 132. A plurality of fasteners (such as 3 to 15 bolts) pass through openings 157 (FIG. 4) in each of the annular gasket portions 145/145' to secure the thermal control plate 101 to the backing plate 106. Furthermore, by using an interface member 151', baffles 120 and shims 146 can be omitted if desired.

By enhancing thermal transfer through the contact regions 132, it is possible to reduce temperature differences between the top electrode 103 including the inner electrode member 105 and the thermal control plate 101, such that "first wafer effects" can also be reduced during consecutive processing of a series of wafers. That is, "first wafer effects" refers to secondary heating of subsequent wafers caused indirectly by the heating of the first-processed wafer. Specifically, upon completion of processing of the first wafer, the heated processed wafer and the process chamber side walls radiate heat toward the upper electrode. The upper electrode then indirectly provides a secondary heating mechanism for subsequent wafers that are processed in the chamber. As a result, the first wafer processed by the system may exhibit a larger than desired critical dimension (CD) variation than subsequent wafers processed by the system since wafer temperature variation can affect CD during etching of high aspect ratio contact vias in semiconductor substrates. Subsequently processed wafers may have different and/or less CD variation than the first processed wafer due to stabilization of temperature in the chamber.

Across-wafer and wafer-to-wafer temperature variation can also be preferably reduced by enhancing thermal transfer through the contact regions 132. Also, chamber-to-chamber temperature matching can be preferably achieved where multiple plasma etching chambers in different processing lines are used for a desired process or throughput, by enhancing thermal transfer through the contact regions 132.

Typically, a one degree Centigrade variation in wafer temperature across-wafer, wafer-to-wafer, or chamber-to-chamber, can cause a CD variation increase at $3\sigma$ ($3\times$ standard deviation) by about 0.5 to 0.1 nm (e.g., 0.4 nm/° C.-0.2 nm/° C. or 0.35 nm/° C.-0.25 nm/° C.).

As mentioned, after the first wafer has been processed, the temperature of subsequently processed wafers can stabilize, such that temperature variation of reference points on subsequently processed wafers is preferably less than about 10° C., more preferably, less than about 5° C., such that, for example, the CD variation can be controlled to within about 5 nm (0.5 nm/° C.×10° C.), more preferably, to within about 3 nm (0.3 nm/° C.×10° C.), most preferably to within about 0.5 nm (0.1 nm/° C.×5° C.) for etching high aspect ratio contact vias in semiconductor substrates.

For memory applications the CD variation is desirably less than 4 nm at $3\sigma$. With the enhanced thermal transfer through the contact regions 132 provided by the interface members 151/151', the CD variation is preferably, 1 nm or less wafer-to-wafer and 4 nm or less chamber-to-chamber. For logic applications the CD variation is desirably less than 3 nm at $3\sigma$. With the enhanced thermal transfer through the contact regions 132 provided by the interface members 151/151', the CD variation is preferably, 2 nm or less wafer-to-wafer and 4 nm or less chamber-to-chamber.

Preferably, the interface members 151/151' minimize temperature shifts from the center of the electrode to the edge of the electrode by less than 10° C. and minimize azimuthal temperature shifts to 5° C. or less. Electrode temperature variation due to use of new or used aluminum backing members is related to the contact surface condition of the new and used aluminum backing members. The interface members 151/151' preferably can minimize electrode temperature shifts caused by new and used aluminum backing members to less than about 5° C. Also, parts may be removed to be cleaned and it is preferred that a part shows the same thermal performance after such cleaning. The interface members 151/151' preferably minimize thermal performance shifts between before and after cleaning of the aluminum backing members to less than about 5° C. change in electrode temperature.

Preferably, the interface members 151/151' can also reduce or prevent fusing or galling of the thermal control plate 101 and aluminum backing member 102, which allows these components to be separated from each other with minimum force.

Preferably, the interface members 151/151' are made of a material that preferably: does not outgas in a high-vacuum environment of, e.g., about 10 to about 200 mTorr; has low particulate generation performance; is compliant to accommodate shear at contact regions; is free of metallic components that are lifetime killers in semiconductor substrates, such as Ag, Ni, Cu and the like; and can minimize the generation of particles during cleaning of the aluminum backing member 102.

FIG. 7 illustrates a portion of another embodiment of a showerhead electrode assembly. Referring to FIGS. 2 and 6, the embodiment shown in FIG. 7 does not include a backing member, and the thermal control plate 101 is secured directly to the inner electrode member 105.

When the top surface 160 of the top electrode 103 and an annular projection 136 of the thermal control plate 101 come into contact in a contact region 158 during operation of the showerhead electrode assembly 100, galling can occur between the thermal control plate 101 and the top electrode 103 including the inner electrode member 105 and the optional outer electrode member 107 along contact regions located between them.

This galling can occur on both of the thermal control plate 101 and the top electrode 103, and is caused by relative motion and rubbing occurring between the opposed surfaces of the thermal control plate 101 and the top electrode 103 as a result of temperature cycling. This galling is undesirable for reasons similar to those described above in relation to the top surface 134 of the aluminum backing plate 106 and an annular projection 136 of the thermal control plate 101 contacting in a contact region during operation of the showerhead electrode assembly 100. For example, galling can cause a reduction in thermal transfer and thus a shift in the temperature including, for example, a localized temperature non-uniformity, of the top electrode 103 including the illustrated inner electrode member 105. This temperature shift can cause a process shift during processing such as plasma etching of semiconductor substrates in the plasma processing chamber.

Galling of the thermal control plate 101 and the top electrode 103 can also cause particle generation, or cause fusing of the thermal control plate 101 and the top electrode 103, which then requires excessive force to separate these components, which can result in damage to these components. Galling of the thermal control plate 101 and the top electrode 103 can also increase the difficulty of cleaning the top electrode 103. Additionally, galling of the thermal control plate 101 and the top electrode 103 degrades the cosmetic appearance of these components and reduces their lifetime.

The showerhead electrode assembly shown in FIG. 7 can also include an optional outer electrode member, such as the outer electrode member 107 shown in FIG. 1. The outer electrode member can have a ring configuration comprised of a plurality of segments. The thermal control plate 101 can be secured directly to the inner electrode member 105 and optional outer electrode member 107 in any suitable manner, such as by fasteners and/or adhesive bonding, such as elastomer bonding. As shown in FIG. 7, there is a contact region 158 between the top surface 160 of the inner electrode member 105 and the annular projection 136 of the thermal control plate 101. In the embodiment, the outer surface of the thermal control plate 101 can be anodized except at the surface at the contact region 158, which is of bare aluminum (non-anodized). Contact region 158 provides a thermal path to remove heat from the inner electrode member 105 and an RF path for RF power passing through the inner electrode member 105.

An interface member 151 such as described above with reference to FIG. 2 is provided between the top surface 160 of the inner electrode member 105 and the annular projection 136 of the thermal control plate 101. As described above, thermally and electrically conductive gasket portion 145 provides a thermal path to remove heat from the inner electrode member 105 and an RF path for RF power passing through the inner electrode member 105. Particle mitigating seal portions 147a/147b are bonded to the gasket portion 145 and are disposed in offsets 139 between the aluminum baffle rings 120 and the top surface 160 to form a gas-tight seal. The upper ends of the vertical walls of the baffle rings 120 are separated from the bottom surface 142 of the thermal control plate 101 by shims 146. The shims 146 are typically made of a dielectric material, such as Kapton®.

Figure 8:
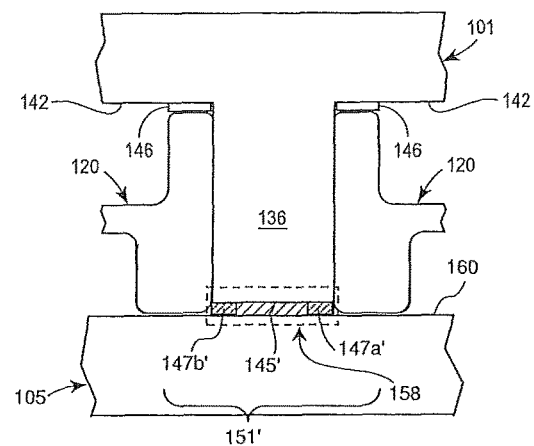
FIG. 8 is an enlarged view of a portion of a showerhead electrode assembly according to the other embodiment including another embodiment of an interface member.

FIG. 8 illustrates an embodiment of an interface member 151' in a showerhead electrode assembly to reduce the occurrence of galling between the thermal control plate 101 and the inner electrode member 105 (and also the optional outer electrode member) along contact regions located between them, and consequently to also reduce problems associated with such galling, such as particle generation. For example, for a silicon electrode member, galling can cause silicon particle generation and aluminum particle generation. Particularly, as shown in FIG. 8, the interface member 151' is located between the bottom surface of the annular projection 136 of the thermal control plate 101 and the top surface 160 of the inner electrode member 105. The interface member 151' separates adjacent ones of the plenums formed in the thermal control plate 101 from each other.

The interface member 151' can be made of the same materials as the interface members 151/151' described above with respect to the embodiment of the showerhead electrode assembly shown in FIGS. 6 and 7. The gasket portion 145' material is electrically and thermally conductive to provide electrical and thermal conduction between the thermal control plate 101 and the inner electrode member 105 (and optional outer electrode member), i.e., the gasket 145' provides an electrically-conductive thermal interface between the contact regions.

As also shown in FIG. 8, shims 146 having about the same thickness as the interface member 151' are located between the aluminum baffle rings 120 and the bottom surface 142 of the thermal control plate 101. The shims 146 can be of a dielectric material. The interface member 151' allows the aluminum baffles 120 and shims 146 to be omitted if desired.

The modification to the showerhead electrode assemblies shown in FIGS. 2 and 6-8 reduce the number of parts, simplify installation and completely cover contact regions 132/158, as well as, reduce the occurrence of galling between the thermal control plate 101 and the inner electrode member 105 (and also the optional outer electrode member) along contact regions 132/158 located between them, and consequently also reduce problems associated with such galling, such as particle generation. For example, for a silicon electrode member, galling can cause silicon particle generation and aluminum particle generation. Particularly, as shown in FIG. 8, an interface member 151' is located between the bottom surface of the annular projection 136 of the thermal control plate 101 and the top surface 160 of the inner electrode member 105. The interface member 151' separates adjacent ones of the plenums formed in the thermal control plate 101 from each other.

While the invention has been described in detail with reference to specific embodiments thereof, it will be apparent to those skilled in the art that various changes and modifications can be made, and equivalents employed, without departing from the scope of the appended claims.

What is claimed is:

1. A showerhead electrode assembly, comprising:
a showerhead electrode adapted to be mounted in an interior of a vacuum chamber;
a thermal control plate attached to the showerhead electrode at multiple contact regions across the showerhead electrode with plenums between the thermal control plate and the showerhead electrode located between the contact regions; and
interface members between the showerhead electrode and the thermal control plate, at the contact regions, wherein each interface member comprises a thermally and electrically conductive gasket portion bonded on a periphery by a particle mitigating seal portion.

2. The showerhead electrode assembly of claim 1, wherein the contact regions comprise spaced apart annular projections on a lower surface of the thermal control plate, the interface members comprising a plurality of annular interface members sized to cover the annular projections, the particle mitigating seal portion bounding the thermally and electrically conductive gasket portion at an outward perimeter and an inward aperture of each interface member.

3. The showerhead electrode assembly of claim 2, wherein the particle mitigating seal portion located at the outward perimeter has a curved surface and protrudes from the electrically conductive gasket portion and the particle mitigating seal portion located at the inward aperture has a curved surface and protrudes from the thermally and electrically conductive gasket portion.

4. The showerhead electrode assembly of claim 3, further comprising baffle rings of anodized aluminum in plenums between the annular projections, each baffle ring including a vertical wall adjacent one of the annular projections, the vertical walls including offsets at lower ends thereof adjacent the contact regions, and each particle mitigating seal portion located in one of the offsets so as to form seals on opposite sides of the contact regions.

5. The showerhead electrode assembly of claim 4, wherein upper ends of the vertical walls of the baffle rings are separated from the lower surface of the thermal control plate by shims having about the same thickness as the thermally and electrically conductive gasket portion of the interface member.

6. The showerhead electrode assembly of claim 1, wherein the thermal control plate is of non-anodized aluminum, the thermally and electrically conductive gasket portion of the interface member is a laminate of metal and polymer materials, and the particle mitigating seal portion of the interface member comprise an erosion resistant elastomer or polymer.

7. The showerhead electrode assembly of claim 1, wherein the showerhead electrode comprises an inner electrode and an outer electrode, and the inner electrode is a circular plate of single crystal silicon and the outer electrode is a ring electrode comprised of a plurality of segments of single crystal silicon.

8. The showerhead electrode assembly of claim 1, further comprising thermal chokes on an upper surface of the thermal control plate.

9. The showerhead electrode assembly of claim 1, wherein the interface member is free of silver, nickel and copper.

10. The showerhead electrode assembly of claim 1, wherein the showerhead electrode includes a silicon electrode plate with gas outlets on one side thereof and the opposite side thereof elastomer bonded to a backing plate which is of non-anodized aluminum.

11. The showerhead electrode assembly of claim 1, wherein:
the contact regions comprise surfaces of spaced-apart annular projections provided on a lower surface of the thermal control plate;
the interface members comprise an annular interface member located between each of the annular projections and an upper surface of the showerhead electrode;
the thermally and electrically conductive gasket portion of the interface members are composed of a laminate of metal and polymer materials free of silver, nickel and copper; and
the particle mitigating seal portion of the interface members bounding an outer perimeter and an inner aperture of each thermally and electrically conductive gasket portion, and is comprised of silicone.

12. The showerhead electrode assembly of claim 11, wherein:
the showerhead electrode comprises an inner electrode and an outer electrode, the inner electrode is a circular plate of single crystal silicon and the outer electrode is a ring electrode comprised of a plurality of segments of single crystal silicon;
the particle mitigating seal portions of the interface members have a curved surface and protrude from an outward perimeter and inward aperture of each thermally and electrically conductive gasket portion; and
the showerhead electrode assembly further comprises:
baffle rings of anodized aluminum in plenums between the annular projections, each baffle ring including a vertical wall adjacent one of the annular projections, the vertical walls including offsets at lower ends thereof adjacent the contact regions; and
the particle mitigating seal portions located in the offsets so as to form seals on opposite sides of the contact regions, wherein upper ends of the vertical walls of the baffle rings are separated from the lower surface of the thermal control plate by shims having about the same thickness as the thermally and electrically conductive gasket portions of the interface members.

13. The showerhead electrode assembly of claim 11, wherein the thermal control plate has an anodized outer surface except at the contact regions which are of non-anodized aluminum.

14. The showerhead electrode assembly of claim 1, further comprising a backing plate attached to an inner electrode of the showerhead electrode, wherein the contact regions cover about 1% to about 30% of a surface area of the backing plate.

15. The vacuum chamber comprising the showerhead electrode assembly of claim 1, further comprising:
a temperature controller controlling a temperature of the showerhead electrode assembly;
a power supply adapted to supply power to a heater which heats the thermal control plate in thermal response to the temperature controller;
a fluid control adapted to supply fluid to a temperature controlled top wall of the vacuum chamber in response to the temperature controller; and
a temperature sensor arrangement adapted to measure a temperature of one or more portions of the showerhead electrode and supply information to the temperature controller,
wherein the top wall of the vacuum chamber is optionally electrically grounded.

16. A method of controlling plasma etching in a plasma etching chamber, comprising:
supplying process gas to the plasma etching chamber through the showerhead electrode assembly of claim 1, the process gas flowing into a gap between the showerhead electrode and a bottom electrode on which a semiconductor substrate is supported; and
etching the semiconductor substrate in the plasma etching chamber by applying RF power to the showerhead electrode and energizing the process gas into a plasma state, wherein a temperature of the showerhead electrode is controlled by the thermal control plate via enhanced thermal conduction through the thermally and electrically conductive gasket portion of the interface members.

17. The method of claim 16, further comprising heating the showerhead electrode to a temperature of at least about 80° C.

18. The method of claim 17, wherein the heating of the showerhead electrode comprises heating and maintaining the showerhead electrode at a temperature of at least about 100° C.

19. The method of claim 17, wherein the heating of the showerhead electrode comprises heating and maintaining the showerhead electrode at a temperature of at least about 180° C.

20. The method of claim 17, wherein the heating of the showerhead electrode occurs before the etching of the semiconductor substrate, and the etching comprises etching openings defined by a patterned photoresist in an oxide layer on the semiconductor substrate.

* * * * *